United States Patent
Lee et al.

(10) Patent No.: US 9,401,375 B2
(45) Date of Patent: Jul. 26, 2016

(54) DISPLAY PANEL AND DISPLAY DEVICE

(71) Applicant: InnoLux Corporation, Jhu-Nan, Miao-Li County (TW)

(72) Inventors: Kuan-Feng Lee, Jhu-Nan (TW); Jung-Fang Chang, Jhu-Nan (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 0 days.

(21) Appl. No.: 14/750,674

(22) Filed: Jun. 25, 2015

(65) Prior Publication Data

US 2016/0093645 A1    Mar. 31, 2016

(30) Foreign Application Priority Data

Sep. 30, 2014 (TW) .............................. 103134075 U

(51) Int. Cl.
| | |
|---|---|
| H01L 51/52 | (2006.01) |
| H01L 27/32 | (2006.01) |
| H01L 27/12 | (2006.01) |
| H01L 29/786 | (2006.01) |

(52) U.S. Cl.
CPC ........ H01L 27/1248 (2013.01); H01L 27/1225 (2013.01); H01L 27/3244 (2013.01); H01L 27/3246 (2013.01); H01L 27/3258 (2013.01); H01L 29/7869 (2013.01); H01L 29/78606 (2013.01)

(58) Field of Classification Search
None
See application file for complete search history.

(56) References Cited

U.S. PATENT DOCUMENTS

| | | | |
|---|---|---|---|
| 6,924,508 B2* | 8/2005 | Yoneda | ............... H01L 51/5237 257/347 |
| 7,931,516 B2 | 4/2011 | Aota | |
| 8,344,374 B2 | 1/2013 | Yamazaki et al. | |
| 8,368,068 B2 | 2/2013 | Cho et al. | |
| 2011/0193067 A1 | 8/2011 | Lee et al. | |
| 2013/0056735 A1* | 3/2013 | Heo | ..................... H01L 51/5246 257/59 |
| 2013/0126876 A1 | 5/2013 | Shin et al. | |
| 2013/0155368 A1 | 6/2013 | Niikura et al. | |
| 2014/0017342 A1 | 1/2014 | Gladwin et al. | |
| 2014/0117342 A1 | 5/2014 | Kwon et al. | |
| 2014/0167008 A1 | 6/2014 | Shin et al. | |
| 2014/0217371 A1* | 8/2014 | Kim | ........................ H01L 51/56 257/40 |
| 2015/0060790 A1* | 3/2015 | Kim | .................... H01L 51/5246 257/40 |

FOREIGN PATENT DOCUMENTS

| | | |
|---|---|---|
| TW | 201427139 A | 7/2014 |
| TW | 201432824 A | 8/2014 |

* cited by examiner

*Primary Examiner* — Minh-Loan Tran
(74) *Attorney, Agent, or Firm* — Muncy, Geissler, Olds & Lowe, P.C.

(57) ABSTRACT

A display panel and a display are disclosed. A display panel has an active area and a peripheral area disposed adjacent to the active area and comprises a first substrate, a second substrate, a first insulating layer, a second insulating layer and an organic layer. The second substrate is disposed opposite the first substrate. The first insulating layer is disposed on the side of the first substrate facing the second substrate. The organic layer covers the first insulating layer. The second insulating layer covers the organic layer and includes at least a first opening which is disposed in the peripheral area and exposes the organic layer.

19 Claims, 10 Drawing Sheets

DISPLAY PANEL AND DISPLAY DEVICE

CROSS REFERENCE TO RELATED APPLICATIONS

This Non-provisional application claims priority under 35 U.S.C. §119(a) on Patent Application No(s). 103134075 filed in Taiwan, Republic of China on Sep. 30, 2014, the entire contents of which are hereby incorporated by reference.

BACKGROUND OF THE INVENTION

1. Field of Invention

This invention relates to a display panel and a display device and, in particular, to a display panel and display device having higher reliability.

2. Related Art

By taking a conventional liquid crystal display (LCD) panel as an example, it includes a thin film transistor (TFT) substrate and a color filter substrate which are disposed oppositely. The TFT substrate includes a plurality of TFTs and a plurality of pixel electrodes which are both disposed on a substrate. The TFTs can be controlled so that the data can be inputted to the pixel electrodes, and thereby the orientation of the liquid crystal can be controlled for the image display.

Due to the raised market competition, the requirements about the size of the display panel or device and the color saturation of the display are rapidly increased as well as the demands for the performance and stability of the TFT. Accordingly, the TFT having metal oxide-based (MOSs) as the material of the semiconductor layer can be manufactured under the room temperature and possess well current output characteristic, lower leakage current and better electron mobility that is ten times higher than the amorphous silicon TFT (a-Si TFT), so as to reduce the power consumption of the display panel and raise the operation frequency of the display panel. Therefore, the metal oxide-based TFT has become the mainstream driving element in the display panel and device.

However, although the metal oxide-based semiconductor layer has better electrical property, it is easily affected by the moisture and oxygen and thus will worsen the reliability of the display panel. Moreover, the material of the organic flatting layer introduced into the high resolution product for increasing the aperture ratio of the display panel has weaker ability to block the moisture than the inorganic material, so that it may absorb the moisture in the manufacturing process to affect the reliability of TFTs and other elements disposed within the active area. Accordingly, in the conventional art, an inorganic insulating layer will be disposed to cover the organic flatting layer to block the moisture so that the organic flatting layer can be prevented from absorbing the moisture and thus affecting the element's characteristic. However, if the organic flatting layer has absorbed the moisture during the process, the moisture may be blocked and thus not be scattered due to the covering of the inorganic insulating layer, and therefore the element's characteristic of the display panel will be affected and the reliability of the product will be thus reduced.

SUMMARY OF THE INVENTION

In view of the foregoing subject, an objective of the invention is to provide a display panel and a display device whereby the degree of the moisture absorption of the organic flatting layer can be effectively reduced, so as to enhance the element's reliability of the display panel and device.

To achieve the above objective, a display panel according to the invention has an active area and a peripheral area disposed adjacent to the active area and comprises a first substrate, a second substrate, a first insulating layer, a second insulating layer, a sealant, a display layer and an organic layer. The second substrate is disposed opposite the first substrate. The first insulating layer is disposed between the first substrate and the second substrate. The second insulating layer is disposed between the first insulating layer and the second substrate. The sealant is disposed in the peripheral area and seals the outer sides of the first substrate and second substrate. The display layer is disposed between the second insulating layer and the second substrate. The organic layer is disposed between the first insulating layer and the second insulating layer. The second insulating layer includes at least a first opening which is disposed in the peripheral area and exposes the organic layer, so that the organic layer contacts the sealant or the display layer.

To achieve the above objective, a display device according to the invention comprises a backlight module and a display panel. The display panel has an active area and a peripheral area disposed adjacent to the active area and comprises a first substrate, a second substrate, a first insulating layer, a second insulating layer, a sealant, a display layer and an organic layer. The second substrate is disposed opposite the first substrate. The first insulating layer is disposed between the first substrate and the second substrate. The second insulating layer is disposed between the first insulating layer and the second substrate. The sealant is disposed in the peripheral area and seals the outer sides of the first substrate and second substrate. The display layer is disposed between the second insulating layer and the second substrate. The organic layer is disposed between the first insulating layer and the second insulating layer. The second insulating layer includes at least a first opening which is disposed in the peripheral area and exposes the organic layer, so that the organic layer contacts the sealant or the display layer.

As mentioned above, in the display panel and display device of this invention, a part of the second insulating layer within the peripheral area is removed to form at least a first opening to expose the organic layer. Therefore, when the moisture permeates the organic layer during the process from outside, the dehydration step can be executed to dissipate the moisture through the first opening before the subsequent panel assembly process is implemented, so as to reduce the moisture content in the organic layer. Therefore, in the display panel that is made by the subsequent process, the degree of the moisture absorption of the organic layer can be effectively reduced and the element's reliability of the display panel can be thus enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

In order to reduce the power consumption of the display panel, raise the operation frequency and increase the aperture ratio, the metal oxide-based TFT and organic material of the passivation layer are introduced into the manufacturing process of the display panel. However, because the metal oxide-based TFT is easily affected by the moisture and oxygen and the ability of the organic material to absorb the moisture is stronger than the inorganic material, the characteristic of the TFT will be easily shifted and the reliability of the display panel will be thus lowered down.

Figure 1:
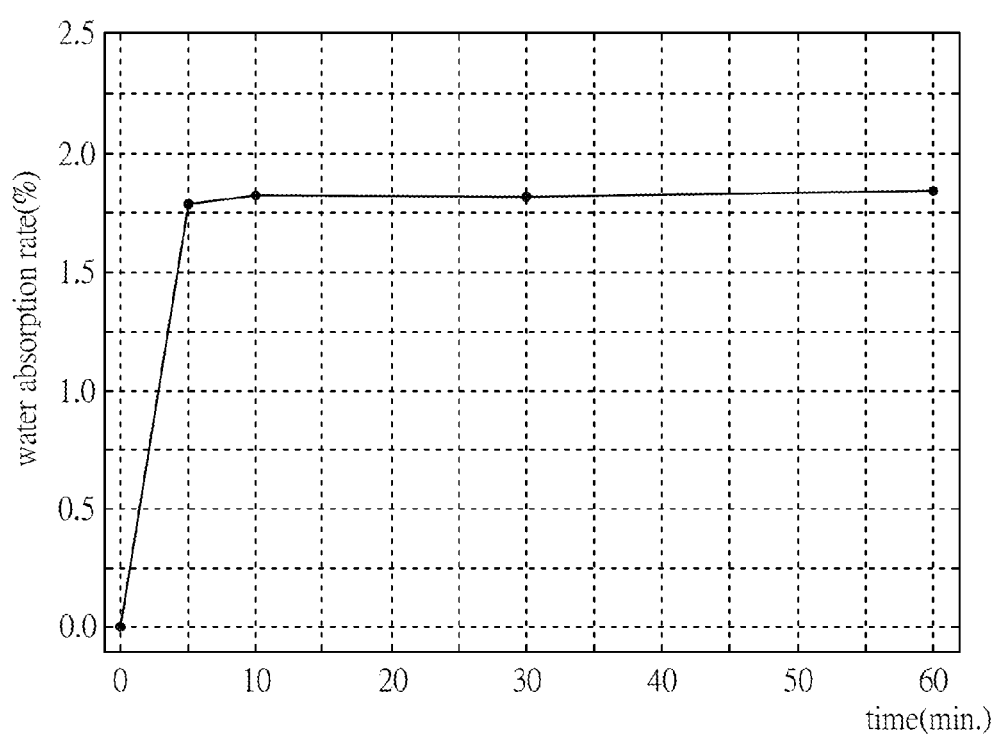
FIG. 1 is a schematic diagram showing the relation between the water absorption rate of an organic material and time.

FIG. 1 is a schematic diagram showing the relation between the water absorption rate of an organic material and time. As shown in FIG. 1, after about five minutes, the water absorption rate of the organic material rises to about 1.8%. Accordingly, a display panel and a display device of an embodiment of the invention are provided to effectively reduce the degree of water absorption of the organic layer, so as to enhance the element's reliability of the display panel and device.

Figure 2A:
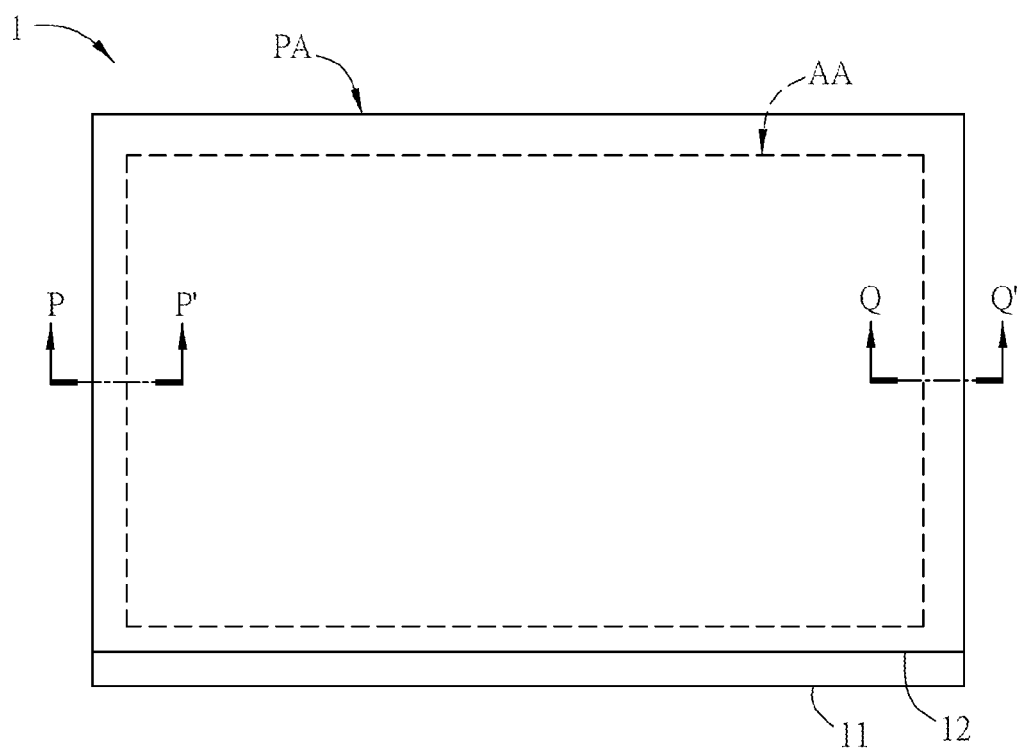
FIG. 2A is a schematic top view of a display panel of an embodiment of the invention.
Figure 2B:
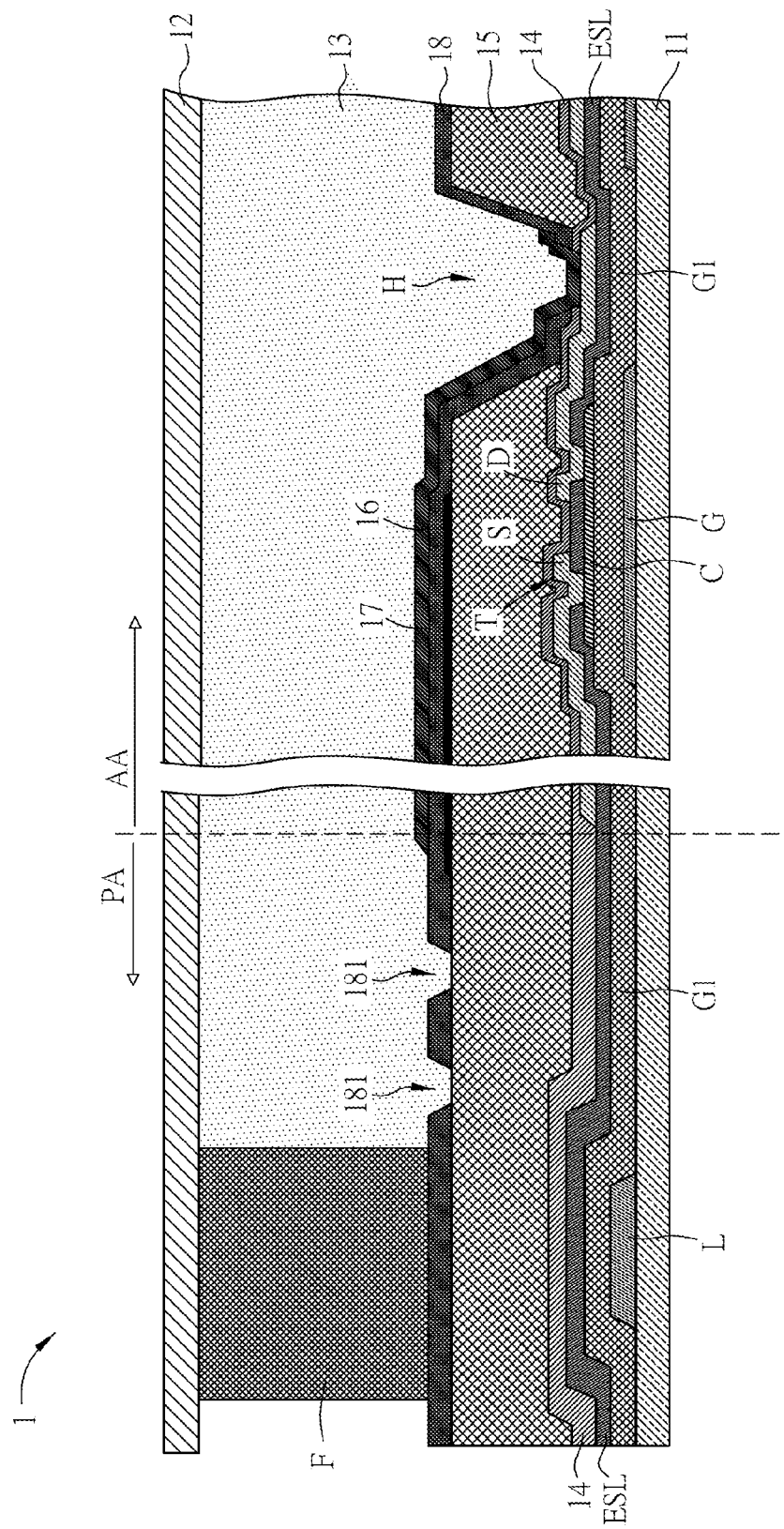
FIG. 2B is a schematic sectional diagram taken along the line P-P' in FIG. 2A.

FIG. 2A is a schematic top view of a display panel 1 of an embodiment of the invention, and FIG. 2B is a schematic sectional diagram taken along the line P-P' in FIG. 2A. As shown in FIGS. 2A and 2B, the display panel 1 can be an LCD panel or an organic light emitting diode (OLED) display panel, and herein an LCD panel is illustrated as an example. The LCD panel can be a fringe field switching (FFS) type, an in plane switching (IPS) type, a twisted nematic (TN) type or a vertical alignment (VA) type, and herein an FFS type of LCD panel is illustrated as an example.

The display panel 1 has an active area AA and a peripheral area PA disposed adjacent to the active area AA. The active area AA is the area of the display panel 1 which is pervious to the light and thereby displays images. The peripheral area PA is the area for the disposition of the driving elements and traces and has a black matrix pattern, so that it is impervious to the light. In this embodiment, the peripheral area PA is disposed around the active area AA for example.

As shown in FIG. 2B, the display panel 1 includes a first substrate 11, a second substrate 12 and a display layer 13. The first substrate 11 and the second substrate 12 are disposed oppositely, and the display layer 13 is disposed between the first substrate 11 and the second substrate 12. Each of the first substrate 11 and the second substrate 12 is made by transparent material, and can be a glass substrate, a quartz substrate or a plastic substrate for example. The display layer 13 of this embodiment is a liquid crystal (LC) layer including a plurality of LC molecules (not shown). In another embodiment where the display panel 1 is an OLED display panel, the display layer 13 can be an organic light emitting diode stack structure, and meanwhile the second substrate 12 can be a cover plate to protect the organic light emitting layer from the pollution of the external moisture or objects.

The display panel 1 of this embodiment can further include a TFT T, a first insulating layer 14, an organic layer 15, a first electrode layer 16, a second electrode layer 17, a second insulating layer 18 and a sealant F.

The TFT T is disposed on the first substrate 11 and within the active area AA. Herein, the TFT T is the switch element of the pixel within the active area AA. The TFT T includes a gate G, a gate insulating layer G1, a channel layer C, a source S and a drain D. The gate G is disposed on the first substrate 11 and can be a single-layer or multi-layer structure formed by metal (e.g. aluminum, copper, silver, molybdenum, or titanium) or alloy. A part of the wires, such as scan lines (not shown), for transmitting driving signals can be the same layer as the gate G and formed in the same process as the gate G, and they can be electrically connected to each other. The gate insulating layer G1 is disposed on and covers the gate G and can be a multi-layer structure formed by an organic material (such as organic silicon/oxide compound), an inorganic material (such as silicon nitride, silicon oxide, silicon oxynitride, silicon carbide, aluminum oxide, hafnium oxide), or their any combination. The gate insulating layer G1 needs to completely cover the gate G and can partially or totally cover the first substrate 11.

The channel layer C is disposed on the gate insulating layer G1 and opposite the gate G. In an embodiment, the channel layer C can include an oxide semiconductor for example. The said oxide semiconductor includes an oxide and the oxide includes one of indium, gallium, zinc and tin. For example, the oxide semiconductor is indium gallium zinc oxide (IGZO). The source S and the drain D are disposed on the channel layer C and contact the channel layer C. When the channel layer C of the TFT T is not turned on, the source S and the drain D are electrically separated from each other. The source S and the drain D can be a single-layer or multi-layer structure formed by metal (e.g. aluminum, copper, silver, molybdenum, or titanium) or alloy. Moreover, a part of the wires, such as data lines (not shown), for transmitting driving signals can be the same layer as the source S and drain D and formed in the same process as the source S and drain D.

Besides, the TFT T of this embodiment further includes an etch stop layer ESL disposed on the channel layer C. One end of each of the source S and the drain D can contact the channel layer C through an opening of the etch stop layer ESL. The etch stop layer ESL can be a single-layer or multi-layer structure formed by an organic material (such as organic silicon/oxide compound), an inorganic material (such as silicon nitride, silicon oxide, silicon oxynitride, silicon carbide, aluminum oxide, hafnium oxide), or their any combination. However, in another embodiment, the source S and drain D can be directly disposed on the channel layer C while the etch stop layer ESL is omitted.

The first insulating layer 14 is disposed between the first substrate 11 and the second substrate 12. Herein for example, the first insulating layer 14 is disposed on the source S and the drain D, covers the TFT T, and is extended to the peripheral area PA. The organic layer 15 is disposed on and covers the first insulating layer 14 for flatting and is extended to the peripheral area PA. Herein for example, the organic layer 15 is disposed between the first insulating layer 14 and the second insulating layer 18. The material of the organic layer 15 can be polyfluoroalkoxy (PFA) for example. The second electrode layer 17 is disposed on the organic layer 15. The second insulating layer 18 is disposed between the first insulating layer 14 and the second substrate 12, covers the organic layer 15 and the second electrode layer 17, and is extended to the peripheral area PA. Each of the first insulating layer 14 and the second insulating layer 18 can be a single-layer or multi-layer structure formed by inorganic material such as SiOx or SiNx, but this invention is not limited thereto.

The first electrode layer 16 is disposed on the second insulating layer 18, and the first electrode layer 16 is also filled into a via H of the organic layer 15 and first insulating layer 14 to connect with the drain D. Herein for example, the first electrode layer 16 is pixel electrode and the second electrode layer 17 is common electrode. However, in other embodiments, the first electrode layer 16 can be common electrode and the second electrode layer 17 can be pixel electrode. The material of each of the first electrode layer 16 and second electrode layer 17 can be, for example, ITO, IZO, AZO, CTO, SnO2, ZnO or other transparent conducting materials.

Moreover, the display panel 1 can further include a black matrix layer and a color filter layer (not shown). The black matrix layer is disposed on the first substrate 11 or the second substrate 12 and corresponding to the TFT T. The color filter layer is disposed on the side of the first substrate 11 facing the second substrate 12 or on the second substrate 12, and is disposed corresponding to the first electrode layer 16. Since the black matrix layer is formed by opaque material, an opaque area (peripheral area PA) can be formed on the first substrate 11 to define a transparent area (active area AA). The black matrix layer and the color filter layer of this embodiment can be disposed on the second substrate 12. However, in another embodiment, the black matrix layer or the color filter layer can be disposed on the first substrate 11 for making a BOA (BM on array) substrate or a COA (color filter on array) substrate. To be noted, the above-mentioned structures are just for example but not for limiting the scope of the invention. Besides, the display panel 1 can further include a protection layer (such as an over-coating, not shown), which can cover the black matrix layer and the color filter layer. The protection layer can include photoresist material, resin material or inorganic material (e.g. SiOx/SiNx) and can protect the black matrix layer and the color filter layer from being damaged during the subsequent processes.

The sealant F is disposed in the peripheral area PA and seals the first substrate 11 and the second substrate 12. The sealant F of this embodiment can be a photocurable adhesive (such as UV adhesive) for example, and can be formed on the first substrate 11 and especially on the second insulating layer 18 herein by coating under the atmosphere for example, so that the LC molecules can be filled into the room bounded by the sealant F for making an LCD panel. However, this invention is not limited thereto. Moreover, the LC molecules can be filled into the room bounded by the sealant F by one drop filling (ODF) process for example, but this invention is not limited thereto.

When a plurality of scan lines of the display panel 1 receive a scan signal sequentially, the TFTs T corresponding to the scan lines can be enabled. Then, the data signals can be transmitted to the corresponding first electrode layers 16 through a plurality of data lines and the display panel 1 can display images accordingly.

As shown in FIG. 2B, in this embodiment, the second insulating layer 18 includes at least a first opening 181, and the first opening 181 is disposed adjacent to the sealant F, between the active area AA and the sealant F, and in the peripheral area PA. The first opening 181 exposes the organic layer 15 so that the organic layer 15 can contact the display layer 13. In an embodiment, a part of the second insulating layer 18 in the peripheral area PA can be removed by etching to form the first opening 181 for example, so that the organic layer 15 will be exposed to the top view of the first opening 181 and contact the display layer 13. Herein for example, the display panel 1 includes two first openings 181 disposed between the sealant F and the active area AA. However, in another embodiment, there can be one or more first openings 181. The first opening 181 can be a through hole or a trench around the peripheral area PA, but this invention is not limited thereto.

In this embodiment, the display panel 1 further includes a trace L which is disposed on the first substrate 11 and adjacent to the sealant F. Herein for example, the trace L has the same material as the gate G (the so-called first metal layer M1). Of course, the trace L may have the same material as the source S or drain D. Moreover, the trace L of this embodiment is covered by sequentially, from bottom to top, the gate insulating layer G1, the etch stop layer ESL, the first insulating layer 14, the organic layer 15 and the second insulating layer 18. The trace L can be used in the connection between the elements or in the anti-electrostatic discharge.

Accordingly, in the display panel 1 of this embodiment, a part of the second insulating layer 18 within the peripheral area PA is removed to form at least a first opening 181 to expose the organic layer 15. Therefore, when the moisture permeates the organic layer 15 during the process from outside, the dehydration step (by heating for example) can be executed to dissipate the moisture through the first opening 181 (the first opening 181 can provide the dissipation path for the moisture that is absorbed by the organic layer 15 and thereby the moisture content can be reduced) before the subsequent panel assembly process is implemented. Therefore, in the display panel 1 that is made by the subsequent process, the degree of the moisture absorption of the organic layer 15 can be effectively reduced and the element's reliability of the display panel 1 can be thus enhanced.

FIGS. 3A to 3E are schematic diagrams of the display panels 1a~1e of different embodiments of the invention.

Figure 3A:
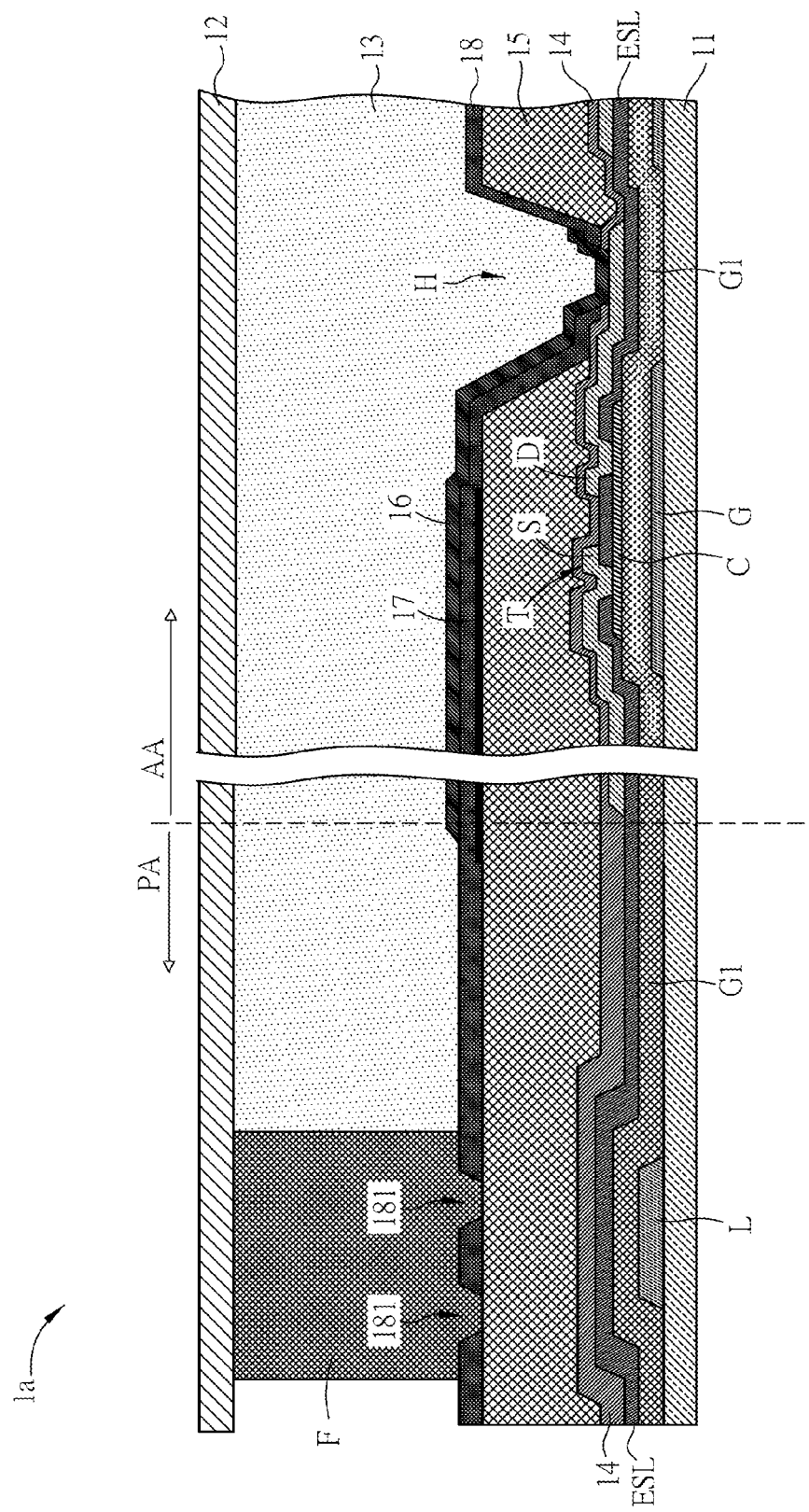
FIGS. 3A to 3E are schematic diagrams of the display panels of different embodiments of the invention.

As shown in FIG. 3A, the main difference between the display panel 1a and the display panel 1 in FIG. 2B is that the two first openings 181 of the display panel 1a are disposed in the width region of the sealant F (i.e. the first openings 181 are sealed by the sealant F) so that the organic layer 15 can contact the sealant F. However, in other embodiments, a part of the first opening 181 can be disposed within the sealant F while another part thereof can be disposed between the sealant F and the active area AA.

Figure 3B:
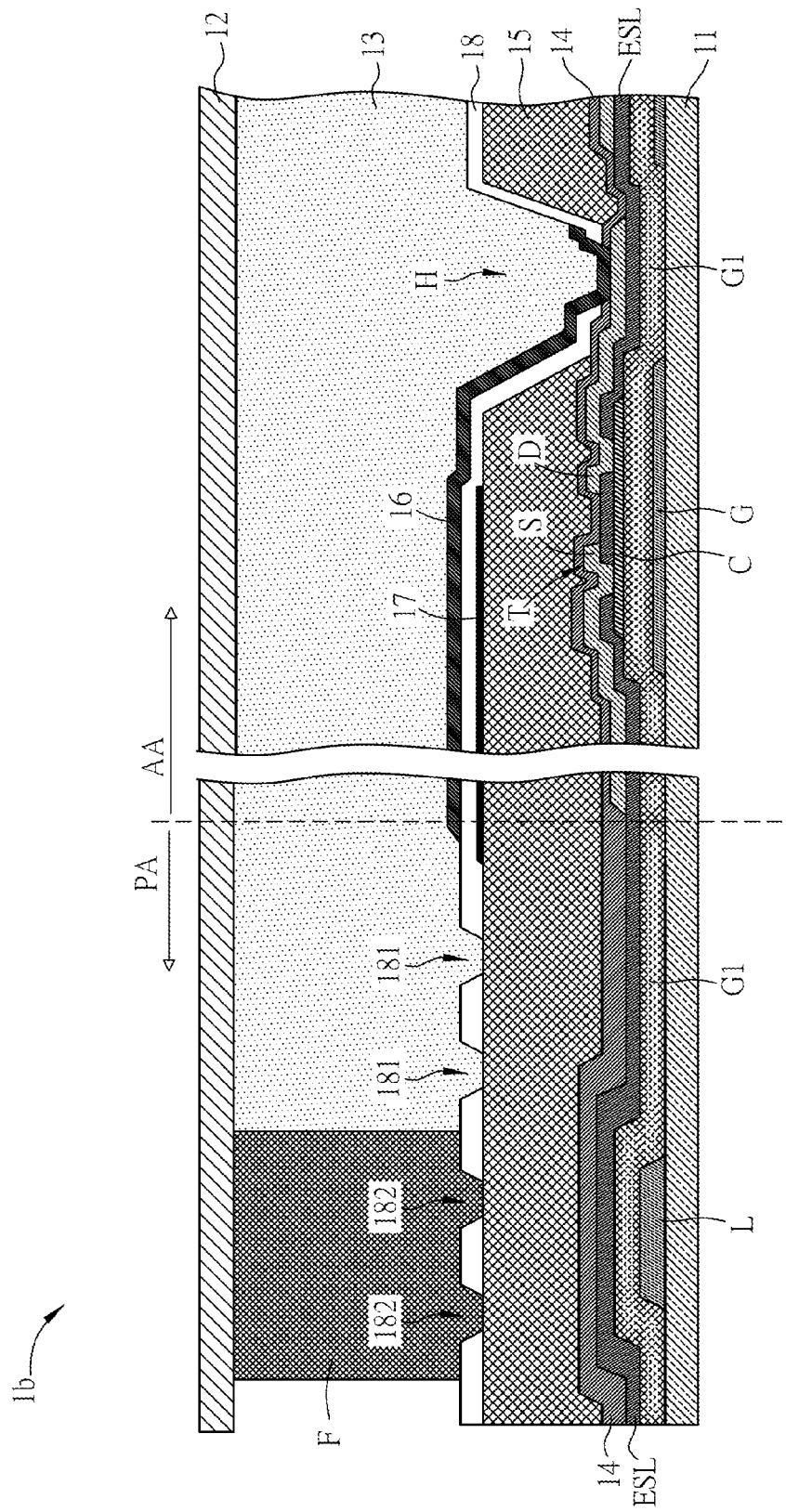

As shown in FIG. 3B, the main difference between the display panel 1b and the display panel 1 in FIG. 2B is that the second insulating layer 18 of the display panel 1b not only includes two first openings 181 disposed between the sealant F and the active area AA, but also includes at least a second opening 182. The second opening 182 is disposed within the width region of the sealant F and also exposes the organic layer 15. Herein, this embodiment includes two second openings 182 which also expose the organic layer 15. Thereby, more dissipation paths of the moisture can be provided.

Figure 3C:
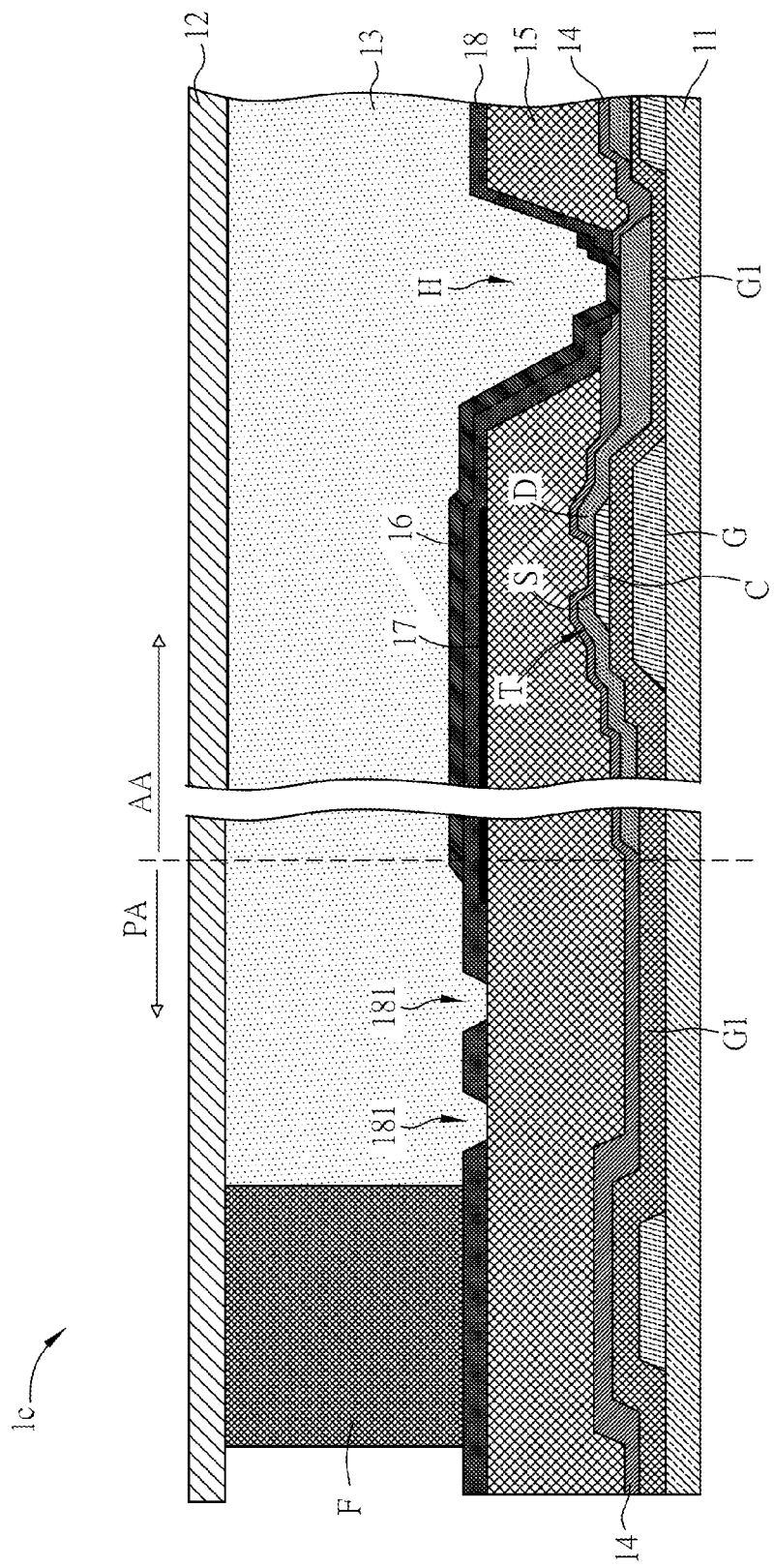

As shown in FIG. 3C, the main difference between the display panel 1c and the display panel 1 in FIG. 2B is that the display panel 1c is without the etch stop layer ESL and the source S and the drain D are directly disposed on the channel layer C. Therefore, the trace L is covered by sequentially, from bottom to top, the gate insulating layer G1, the first insulating layer 14, the organic layer 15 and the second insulating layer 18.

Figure 3D:
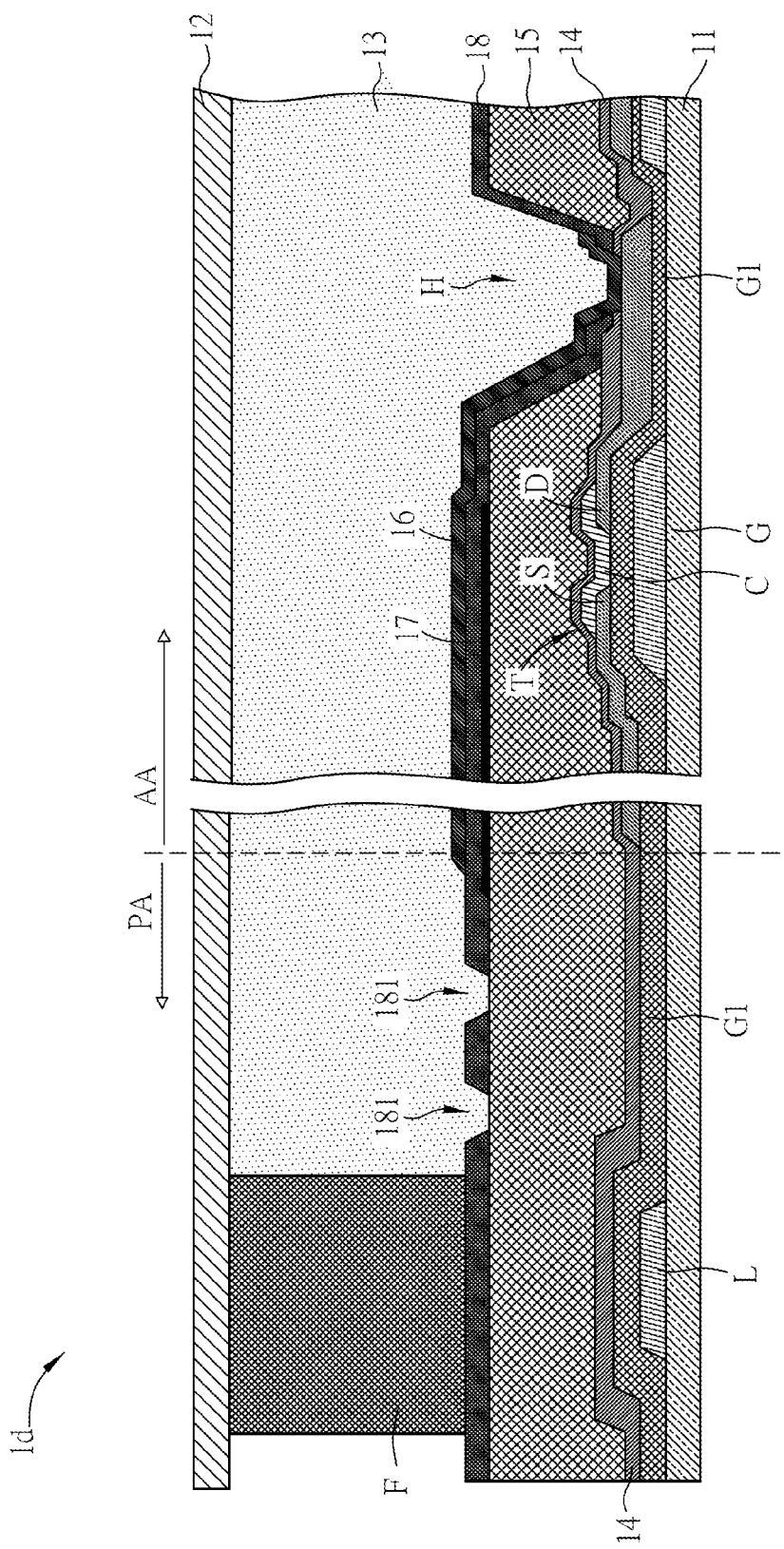

As shown in FIG. 3D, the main difference between the display panel 1d and the display panel 1 in FIG. 2B is that the display panel 1d is also without the etch stop layer ESL and the source D, the drain D and the channel layer C of the display panel 1d have an opposite sequence of the disposition. In other words, the patterns of the source S and drain D are formed on the gate insulating layer G1 firstly, and then the channel layer C is formed on the source S and drain D and contacts the source S and drain D.

Figure 3E:
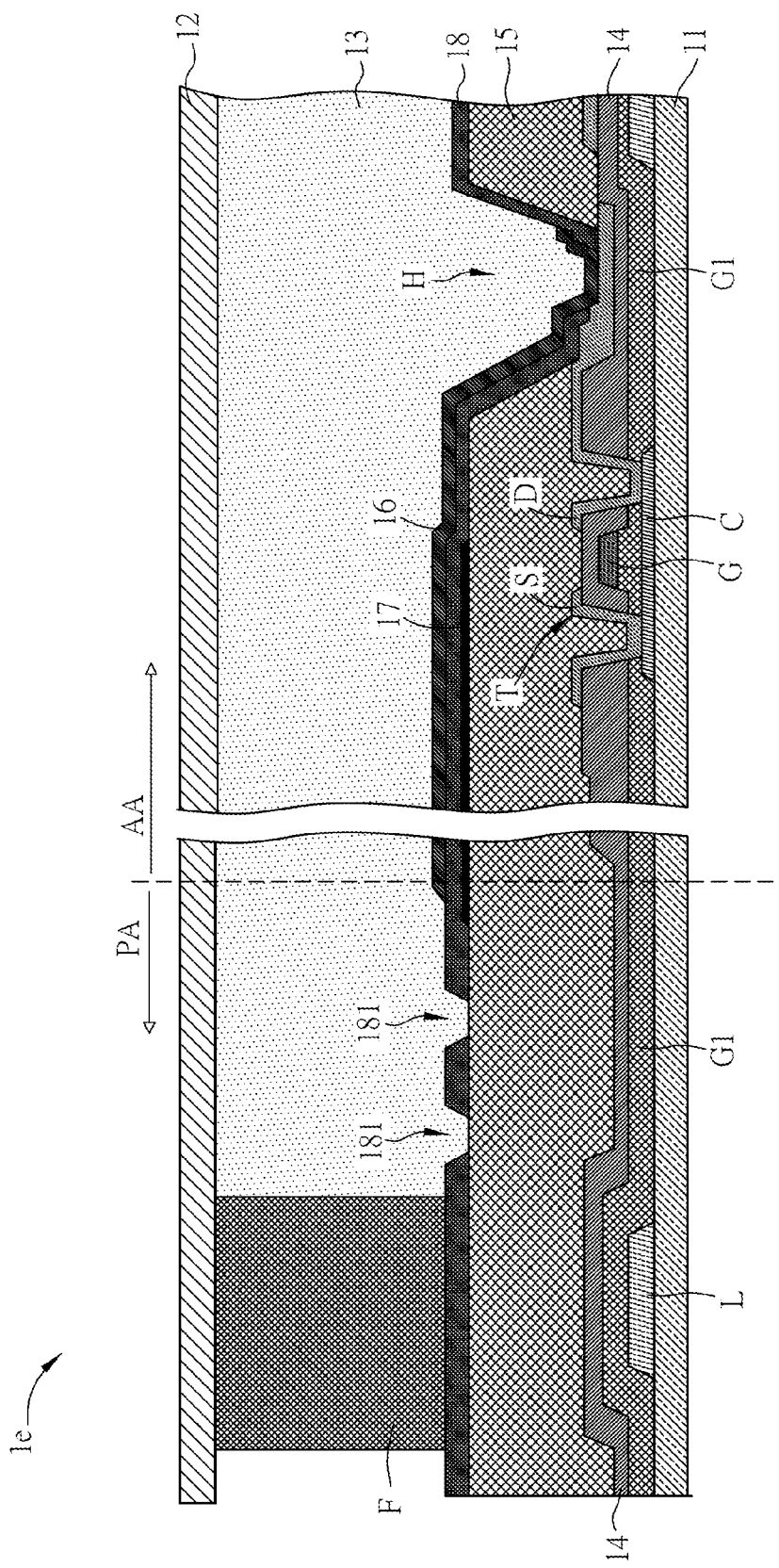

As shown in FIG. 3E, the main difference between the display panel 1e and the display panel 1 in FIG. 2B is that the display panel 1e is also without the etch stop layer ESL and the TFT T of the display panel 1e is a top gate structure where the gate G is disposed over the channel layer C and each of the source S and the drain D contacts the channel layer C through a via of the gate insulating layer G1 and first insulating layer 14.

Figure 3F:
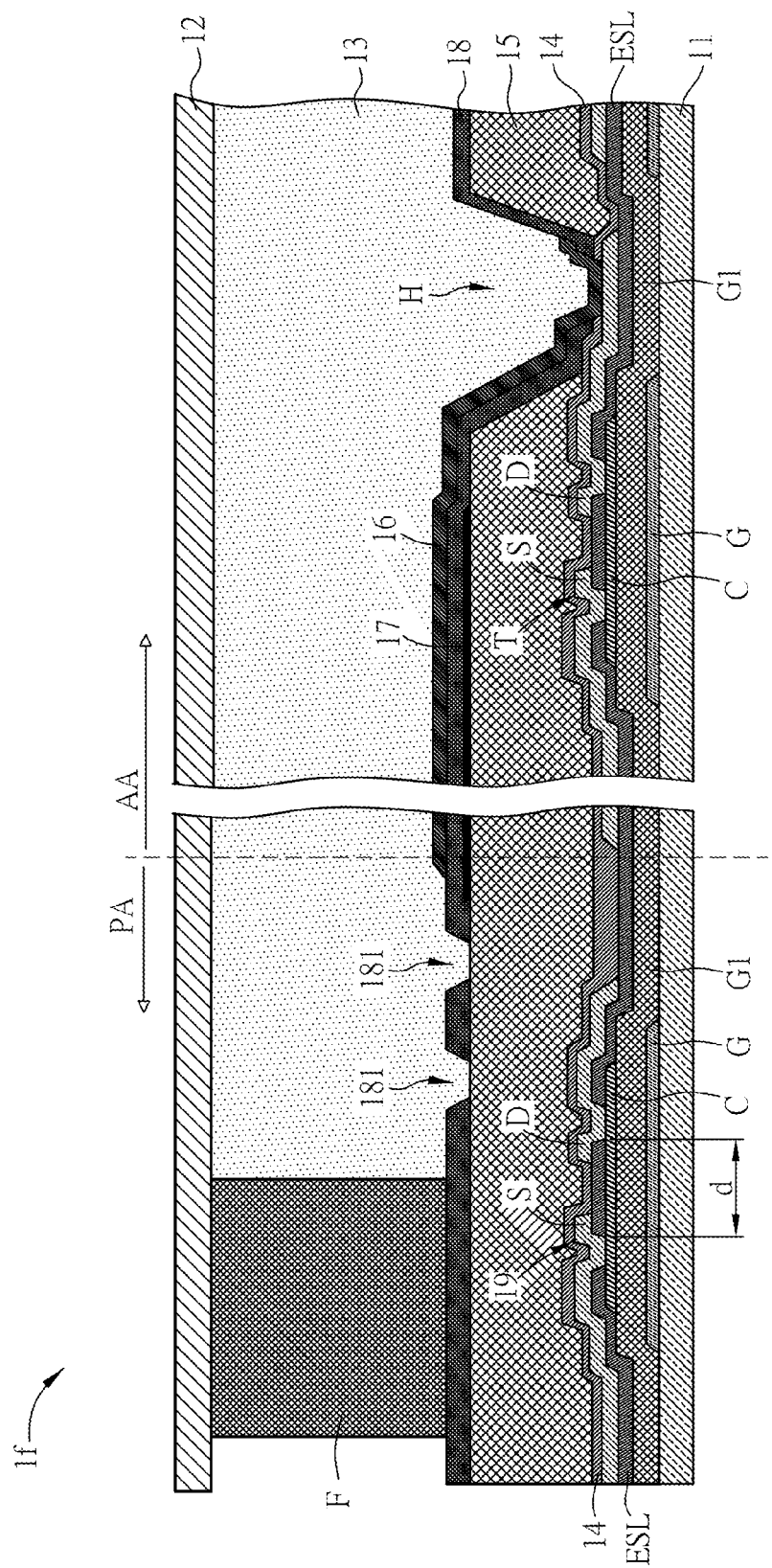
FIG. 3F is a schematic sectional diagram of the display panel taken along the line Q-Q' in FIG. 2A.

FIG. 3F is a schematic sectional diagram of the display panel taken along the line Q-Q' in FIG. 2A. As shown in FIG. 3F, herein the sectional position of the line Q-Q' can be the region of the first substrate 11 where the gate driver circuit is directly formed, i.e. GOP (gate on panel), so that FIG. 3F is the schematic sectional diagram of the region where the gate driver circuit of the display panel 1f is disposed.

The main difference from the display panel 1 of FIG. 2B is that the display panel 1f of FIG. 3F can further include an electronic element 19. The electronic element 19 is disposed adjacent to the first opening 181 and in the peripheral area PA, and can be electrically connected to the TFT T. Herein for example, the electronic element 19 is a driving element used to drive the element within the active area AA of the display panel 1f. For example, the electronic element 19 can be a TFT which can have the structure of the above-mentioned TFT T, so the related illustration is omitted here for conciseness. However, in another embodiment, the electronic element 19 can be not a TFT but another type of element, such as a diode or a capacitor.

The technical features of other elements of the display panels 1a~1f can be comprehended by referring to the display panel 1, and therefore the related illustration is omitted here for conciseness.

However, to be noted, in FIG. 3F, since the electronic element 19 is a TFT, the location of the first opening 181 needs to have some limitation in order to protect the channel layer C of the TFT. As shown in FIG. 3F, the location of the contact between the drain D and the channel layer C and the location of the contact between the source S and the channel layer C have a gap d therebetween, and the first opening 181 and the region of the gap d have no overlap therebetween along a direction perpendicular to the first substrate 11 (i.e. the first opening 181 doesn't exist directly above the region of the gap d).

To be noted, the first opening 181 of the above-mentioned display panels 1c~1f also may be disposed in the width region of the sealant F. Otherwise, in addition to the first opening 181 disposed between the sealant F and the active area AA, the display panels 1c~1f also may include the second opening 182 which is disposed in the sealant F and also exposes the organic layer 15.

Figure 4:
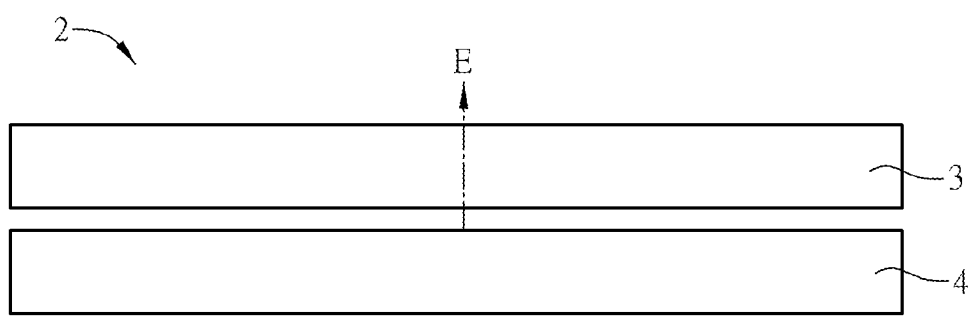
FIG. 4 is a schematic diagram of a display device of an embodiment of the invention.

FIG. 4 is a schematic diagram of a display device 2 of an embodiment of the invention.

As shown in FIG. 4, the display device 2 includes a display panel 3 and a backlight module 4 disposed opposite the display panel 3. The display device 2 is an LCD device, and the display panel 3 can include any of the above-mentioned display panels 1, 1a~1f or their variation, and therefore the related illustration can be comprehended by referring to the above embodiments and is thus omitted here for conciseness. When the backlight module 4 emits the light E passing through the display panel 3, the pixels of the display panel 3 can display colors to form images accordingly.

Summarily, in the display panel and display device of this invention, a part of the second insulating layer within the peripheral area is removed to form at least a first opening to expose the organic layer. Therefore, when the moisture permeates the organic layer during the process from outside, the dehydration step can be executed to dissipate the moisture through the first opening before the subsequent panel assembly process is implemented, so as to reduce the moisture content in the organic layer. Therefore, in the display panel that is made by the subsequent process, the degree of the moisture absorption of the organic layer can be effectively reduced and the element's reliability of the display panel can be thus enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel having an active area and a peripheral area, comprising:
   a first substrate;
   a second substrate;
   a first insulating layer disposed between the first substrate and the second substrate;
   a second insulating layer disposed between the first insulating layer and the second substrate;
   a sealant disposed within the peripheral area and disposed between the first substrate and second substrate;
   a display layer disposed between the second insulating layer and the second substrate; and
   an organic layer disposed between the first insulating layer and the second insulating layer,
   wherein the second insulating layer has at least one first opening, the at least one first opening is disposed within the peripheral area and exposes the organic layer, and the organic layer contacts with the sealant or the display layer through the at least one first opening.

2. The display panel as recited in claim 1, wherein the first opening is a through hole or a trench around the peripheral area.

3. The display panel as recited in claim 1, wherein the first opening is disposed within the width region of the sealant.

4. The display panel as recited in claim 1, wherein the first opening is disposed between the sealant and the active area.

5. The display panel as recited in claim 4, wherein the second insulating layer further includes at least one second opening which exposes the organic layer and is disposed within the width region of the sealant.

6. The display panel as recited in claim 1, further comprising:
   a thin film transistor disposed on the first substrate and within the active area, including a drain, a source and a channel layer, wherein the source and the drain contact the channel layer and the first insulating layer covers the thin film transistor; and
   a first electrode layer disposed on the second insulating layer and filled into a via through the organic layer and the first insulating layer to connect with the drain.

7. The display panel as recited in claim 6, wherein the thin film transistor further includes an etch stop layer disposed on the channel layer.

8. The display panel as recited in claim 7, wherein the source and the drain contact the channel layer through an opening of the etch stop layer.

9. The display panel as recited in claim 6, wherein the material of the channel layer is metal oxide semiconductor.

10. The display panel as recited in claim 1, further comprising:

an electronic element disposed adjacent to the at least one first opening and within the peripheral area.

11. The display panel as recited in claim 10, wherein the electronic element is a thin film transistor disposed on the first substrate and within the peripheral area including a drain, a source and a channel layer, the source and the drain contact the channel layer, the location of the contact between the drain and the channel layer and the location of the contact between the source and the channel layer have a gap therebetween, and the at least one first opening and the gap have no overlap along a direction perpendicular to the first substrate.

12. A display device, comprising:
a backlight module; and
a display panel having an active area and a peripheral area, comprising:
 a first substrate;
 a second substrate;
 a first insulating layer disposed between the first substrate and the second substrate;
 a second insulating layer disposed between the first insulating layer and the second substrate;
 a sealant disposed within the peripheral area and disposed between the first substrate and second substrate;
 a display layer disposed between the second insulating layer and the second substrate; and
 an organic layer disposed between the first insulating layer and the second insulating layer,
 wherein the second insulating layer has at least one first opening, the at least one first opening is disposed within the peripheral area and exposes the organic layer, and the organic layer contacts with the sealant or the display layer through the at least one first opening.

13. The display device as recited in claim 12, wherein the first opening is disposed within the width region of the sealant.

14. The display device as recited in claim 12, wherein the first opening is disposed between the sealant and the active area.

15. The display device as recited in claim 14, wherein the second insulating layer further includes at least one second opening which exposes the organic layer and is disposed within the width region of the sealant.

16. The display device as recited in claim 12, further comprising:
a thin film transistor disposed on the first substrate and within the active area, including a drain, a source and a channel layer, wherein the source and the drain contact the channel layer and the first insulating layer covers the thin film transistor; and
a first electrode layer disposed on the second insulating layer and filled into a via through the organic layer and the first insulating layer to connect with the drain.

17. The display device as recited in claim 16, wherein the thin film transistor further includes an etch stop layer disposed on the channel layer.

18. The display device as recited in claim 12, further comprising:
an electronic element disposed adjacent to the at least one first opening and in the peripheral area.

19. The display device as recited in claim 18, wherein the electronic element is a thin film transistor disposed on the first substrate and within the peripheral area, including a drain, a source and a channel layer, the source and the drain contact the channel layer, the location of the contact between the drain and the channel layer and the location of the contact between the source and the channel layer have a gap therebetween, and the at least one first opening and the gap have no overlap therebetween along a direction perpendicular to the first substrate.

* * * * *